(12) United States Patent
Syed et al.

(10) Patent No.: US 6,545,220 B2
(45) Date of Patent: Apr. 8, 2003

(54) SHIELDED CABLE SYSTEM FOR HIGH SPEED CABLE TERMINATION

(75) Inventors: Farrukh S. Syed, McKinney, TX (US); Brent A. Boudreaux, Highland Village, TX (US); Eric C. Peterson, McKinney, TX (US); Richard Schumacher, Dallas, TX (US); Martha G. Peterson, McKinney, TX (US); J. Michael Andrewartha, Plano, TX (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/944,537

(22) Filed: Aug. 31, 2001

(65) Prior Publication Data

US 2003/0042032 A1 Mar. 6, 2003

(51) Int. Cl.[7] .................................................. H02G 15/06
(52) U.S. Cl. ...................................... 174/75 C; 174/78
(58) Field of Search ................................. 174/78, 75 C; 439/98, 99, 578, 610

(56) References Cited

U.S. PATENT DOCUMENTS

| | | | | |
|---|---|---|---|---|
| 2,696,518 A | * | 12/1954 | Roehmann et al. | 174/21 C |
| 3,546,365 A | * | 12/1970 | Collier | 174/75 C |
| 5,028,742 A | * | 7/1991 | Redman | 174/78 |
| 5,266,744 A | * | 11/1993 | Fitzmaurice | 174/103 |
| 6,107,572 A | * | 8/2000 | Miyazaki | 174/75 C |

* cited by examiner

*Primary Examiner*—Chau N. Nguyen

(57) ABSTRACT

A shielded cable assembly contains one or more hardpoints that resist damage arising from possible collapse of the shielded cable assembly under strong compressional forces that are exerted by a clamp assembly in the form of a separable block having first and second opposed members. The hardpoint contains a conduit that protects a data transfer line or cable bundle by compressing electromagnetic shielding between the conduit and the clamp assembly. Cable electromagnetic shielding may be exposed over a selected hardpoint for use as needed in a particular application.

15 Claims, 4 Drawing Sheets

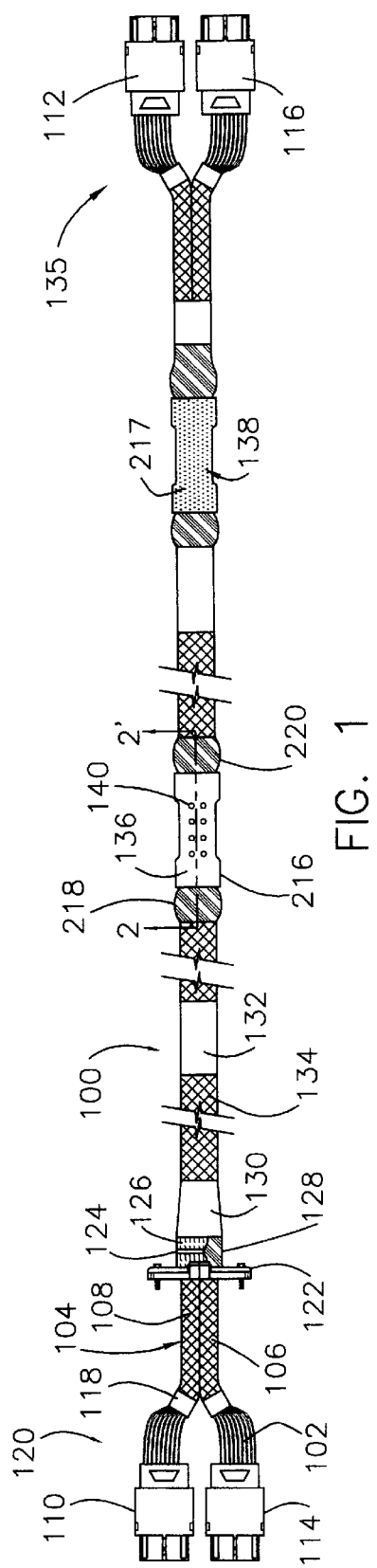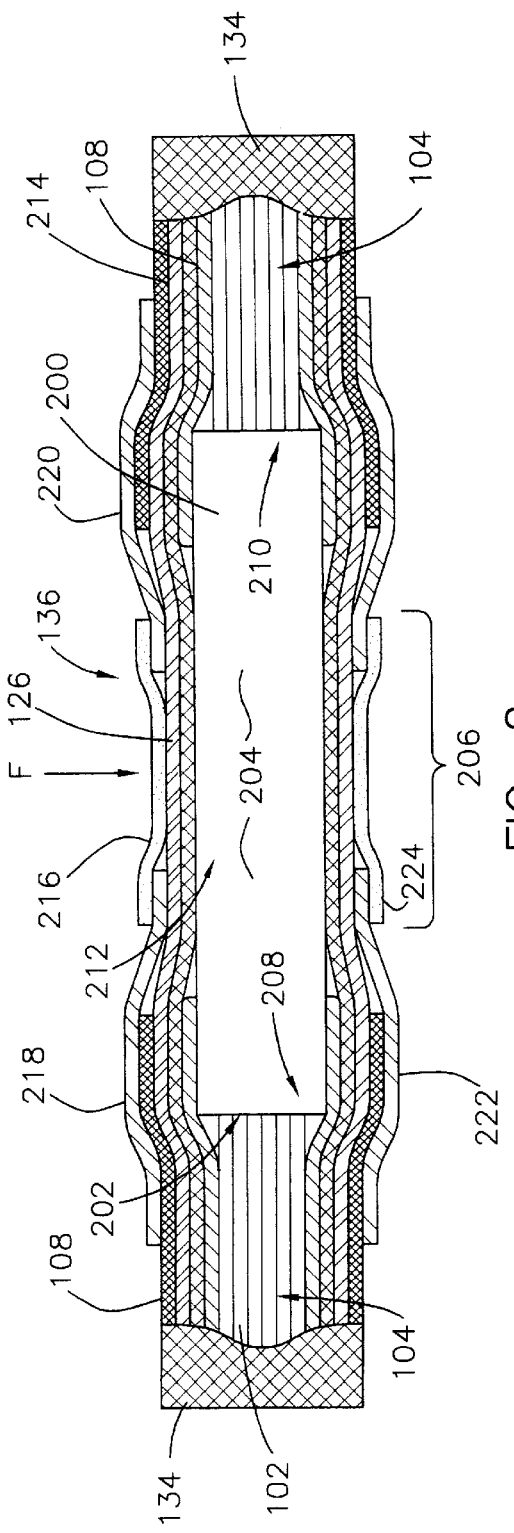
FIG. 1
FIG. 2

SHIELDED CABLE SYSTEM FOR HIGH SPEED CABLE TERMINATION

RELATED APPLICATIONS

This application is related to copending and cofiled applications for U.S. Pat. Ser. No. 09/943,924, filed Aug. 31, 2001 and entitled CLAMP SYSTEM FOR HIGH SPEED CABLE TERMINATION Ser. No. 09/945,069, filed Aug. 31, 2001 and entitled CABLE SHIELD TERMINATION SYSTEM USING CLAMPS AND FERRULES.

BACKGROUND OF THE INVENTION

1. Field of the Invention

The invention pertains to the field of shielded cables for use in high speed data transmissions and associated cable retention mechanisms. More specifically, ground receptacles are used in mounting the cables to electrical housings or chassis in a manner that minimizes electromagnetic interference (EMI).

2. Discussion of the Related Art

Cables for use in transmitting electronic signals are often provided with shielding in the form of foil, wire mesh or screen material that surrounds one or more central insulated leads. One common example of this type of cable is the coaxial cable that is used to carry television or data transmissions; however, in computer applications, there are often a plurality of data transfer lines in the form of a cable bundle. The shielding itself is usually covered with an external layer of insulation or a protective outer layer. The shielding protects the signal that is being transmitted on the central lead from ambient electromagnetic disturbances. The shielding also limits the amount of electromagnetic disturbance that is transmitted outwardly from the central lead. For these reasons, shielded cables are increasingly utilized in densely packed arrays of electrical equipment.

A variety of connectors are used to secure and interconnect these cables. Typically, bulkhead connectors, which connect the shielding to a ground proximate the terminus of the cable, are used for shielded cables. Nevertheless, it is not always desirable or practical to connect the cable to ground solely at its terminus. For example, U.S. Pat. No. 5,975,953 to Peterson describes the difficulties and special considerations that are involved when connecting electromagnetic interference (EMI) shielded cables directly to an input/output (I/O) card and having to shunt the ground path through the I/O card.

Further, in the case of bulkhead connectors, a continuing problem exists with securing the cables against unwanted motion that can, for example, cause signal degradation by torsional or translational motion of the cable. Prior systems are unable to secure the cable against unwanted motion while providing a ground for the EMI shielding. Separate structures, such as a rubber grommet that is separate from the bulkhead connector are often used to limit such motion, but constitute poor electrical conductors and may facilitate EMI leaks form an otherwise closed EMI housing.

Regulatory agencies are promulgating ever stricter regulations that increasingly limit the amount of EMI which electronic equipment may generate. Additionally, stricter EMI limits are necessarily imposed by the practicalities of operating computer and telecommunications systems at increasingly faster rates of data transmission. Whenever a cable passes through the wall of an electrical housing or chassis, the opening may provide an unacceptable EMI leak. Increasingly, it is necessary to seal openings electrical housings, in order to prevent EMI leaks. At the same time, it is useful to be able establish EMI seals at multiple optional locations on a single cable construction, to reduce the number of unique cable constructions which would otherwise have to be manufactured and stocked, and to configure these as needed at the time of installation.

SUMMARY OF THE INVENTION

The present invention overcomes the problems that are outlined above by providing a shielded cable assembly for use in conveying data signals through a chassis wall with a substantially complete EMI seal.

The shielded cable comprises at least one data transfer line, which may also be part of a cable bundle. The data transfer line typically includes an electrically conductive lead for use in transmitting the signal; however, use of a data transfer line communicating optical signals is also contemplated, as are combinations of electrical and optical data transfer lines in a single cable. Electromagnetic shielding surrounds the data transfer line. The shielded cable contains a first hardpoint comprising a conduit positioned around the data transfer line over an interval at a preselected location for use in passing through the chassis wall. The conduit defines an interior passageway and has an exterior side. The data transfer line passes through the interior passageway of the conduit, and the electromagnetic shielding surrounds the exterior side of the conduit. Thus, when a clamp assembly is placed around the shielding over the conduit, a superior mechanically secure ground connection is established by compressive forces that are exerted between the exterior side of the conduit and the clamp assembly.

Various other components are optionally provided in the shielded cable. For example, a protective covering may surround the data transfer line at a position within the electromagnetic shielding. The protective covering is absent over a section of the interval over the conduit. The conduit may have a first end inserted within the protective covering, a second end inserted within the protective covering, and a middle section comprising the area where the protective covering is absent. An electrically insulative material, such as adhesive-backed electrical tape, may be positioned around the conduit and within the electromagnetic shielding to secure the conduit. An outer sleeve may be placed around the data transfer line and the electromagnetic shielding, but a portion of the outer sleeve must be removed over the section of the conduit where the protective covering is also absent, in order to facilitate access to the electromagnetic shielding for purposes of establishing a ground connection.

In some embodiments, a selectively detachable tube covers electromagnetic shielding over the section of the conduit where the outer sleeve is absent. The selectively detachable tube may comprise a tear-away material having a pattern of holes that are spaced apart at distances which facilitate removal of the selectively detachable tube in predetermined lengths. A shrink-wrap layer may surround at least one end of the conduit. The shrink wrap layer overlaps the outer sleeve at a position outboard of the outer sleeve and underlap the selectively detachable tube inboard of the selectively detachable tube for containment of metal fragment from the electromagnetic shielding. The provision of a selectively detachable tube expedites custom installation procedures by affording quick access to the electromagnetic shielding, which is exposed by simply peeling away the selectively detachable tube.

The data transfer line may comprise a first end connected to a first cable coupling, a second end connected to a second cable coupling. A plurality of hardpoints may be provided including a hardpoint at any interval location where the shielded cable could pass through an electrical housing or chassis.

A clamp assembly, such as a separable block, may be used to retain the shielded cable on the electrical housing or chassis and to establish a grounded connection between the electromagnetic shielding and the chassis by virtue of compressive forces over the interval between the clamp assembly and the conduit. The conduit is sufficiently rigid to withstand the compressive forces from the clamp assembly while protecting the data transfer line from damage that would, otherwise, possibly inure to the data transfer line from the compressive forces. As used herein, the term "separable block" encompasses a clamping structure that is formed of two or more pieces, as well as structures where these pieces are joined by a hinge or pivot, for example, in a bivalve configuration.

DESCRIPTION OF THE DRAWINGS

FIG. 1 depicts a shielded cable that contains hardpoints for use in establishing a grounded connection between the shielded cable and an electrical housing or chassis;

FIG. 2 depicts a midsectional view of one of the hardpoints taken along line 2–2' of FIG. 1;

DETAILED DESCRIPTION

Figure 3:
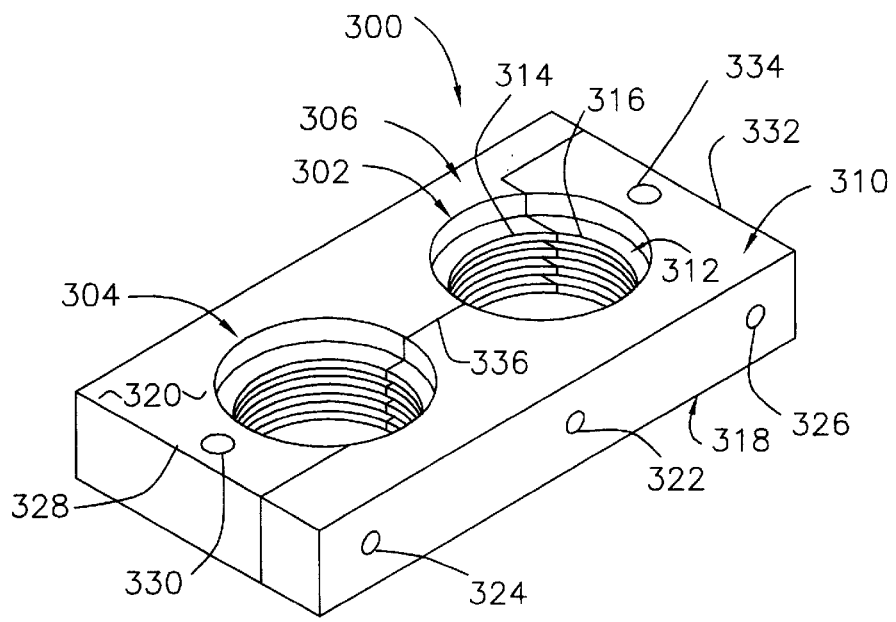
FIG. 3 depicts a separable block comprising a first member and a second member for use as a clamp assembly in attaching the hardpoint shown in FIG. 2 to the electrical housing or chassis.

The following detailed description illustrates a preferred embodiment of a shielded cable that contains hardpoints for use in establishing grounded connections over predetermined intervals that are located, for example, where the shielded cable passes through an electrical housing or chassis. The use of a preferred example should not be construed to impart undue limitation to the concepts that are disclosed herein because the teaching is by way of example and not by limitation.

FIG. 1 depicts a shielded cable 100 for use in high speed data transmission. The cable 100 includes at least one data transfer line, such as data transfer line 102, which preferably but optionally forms part of a first cable bundle 104 comprising a plurality of such data transfer lines. Additional cable bundles, such as a second cable bundle 106, may travel coextensively with the first cable bundle 104. Each of the cable bundles 104 and 106 may be surrounded by a protective covering, such as an insulator or sheath 108. The respective data transfer lines 102 are coupled at remote ends with corresponding first data couplings 110 and 112 in the case of first cable bundle 104, and second data couplings 114 and 116 in the case of second cable bundle 106. The protective covering 108 is optionally secured to the first cable bundle 104 through use of adhesively back electrical tape 118.

A first end 120 of shielded cable 100 may, for example, be used for coupling with an input/output bay (not shown). A conventional bulkhead mounting bracket 122 is optionally used to secure the first end 120 with a grounded connection being established between the input/output bay and shielded cable 100 through use of a clamp 124 that compresses electromagnetic shielding 126 against the bulkhead mounting bracket 122. Shrink wrap 128 is optionally provided to cover the electromagnetic shielding 126, which is typically formed of braided metal strands or foil, for purposes of containing metal strand of fragments that could break free from the electromagnetic shielding 126. An elastomeric cable reinforcer 130 is also optionally provided to prevent cable motion from fatiguing the electromagnetic shielding with resultant degradation of the grounded connection between the electromagnetic shielding 126 and the bulkhead mounting bracket 122. Labeling, such as label 132, may optionally be used to provide indicia with descriptive information concerning the type of shielded cable 100, as well as information concerning its use and operating characteristics.

An outer sheath 134, such as an insulator or plastic mesh, surrounds and packages the shielded cable 100. A second end 134 of shielded cable 100 may connect, for example, with electrical components inside a cabinet that houses a central processor (not shown). Hardpoints 136 and 138 are provided on the shielded cable 100 at selected locations covering intervals where the shielded cable 100 is intended to pass through a chassis or electrical housing (not shown). By way of example, the chassis or electrical housing may be the housing for the input/output bay or the central processor cabinet that have been previously described.

FIG. 2 is a midsectional view taken along line 2–2' of FIG. 1. A conduit 200 surrounds the first cable bundle 104 and data transfer line 102. The conduit 200 defines an interior passageway 202 through which the first cable bundle 104 passes. Conduit 200 protects the first cable bundle 104 from potential damage due to external compressive forces F. As shown in FIG. 2, conduit 200 has a circular cross-section that solely accommodates interior receipt of the first cable bundle 104. Conduit 200 may alternatively have any other shape, such as an oblong cylindrical, or ovaloid cross-section (not shown) that accommodates both the first cable bundle 104 and the second cable bundle 106, which may also be combined into a single cable bundle within the interior passageway 202. Conduit 200 presents an exterior side 204 that is surrounded by the electromagnetic shielding 126. PVC plastic is an especially preferred material for use in making conduit 200.

The protective covering 108 and the outer sheath 134 are absent, i.e., discontinuous, over a section or portion 206 radially outboard of conduit 200. A first end 208 of conduit 200 passes beneath the protective covering 108, as does a second end 210, but a middle section 212 of conduit 200 is not covered by the protective covering 108 or the outer sheath 134. An insulative material 214, such as adhesive-backed electrical tape, is optionally wrapped around conduit 200 with mutual overlapping reinforcement against the protective covering 108 to secure conduit 200 in place.

In the arrangement shown, the electromagnetic shielding 126 would be uncovered and exposed, except for the provision of a selectively detachable tube 216, a first shrink wrap 218 segment, and a second shrink-wrap segment 220. The first and second shrink-wrap segments 218, 220 respectively overlap the first and second ends 208 and 210, extending inwardly over the middle section 212 beyond the protective layer 108 and the outer sleeve 134. Another selectively detachable tube 217 (see FIG. 1) may be provided to cover hardpoint 138.

The selectively detachable tubes 216 and 217 comprise a tear-away material, such as a low-shear shrink-wrap or plastic coating. As shown in FIG. 1, a plurality of holes 140 are provided at distances that are selectively spaced apart from one another to facilitate removal of the selectively detachable tube 216 or 217 in lengths as needed.

The first and second shrink-wrap sections 218 and 220 are optional components that contain any metal fragments which, otherwise, could devolve from the electromagnetic shielding 126. The first and second shrink-wrap sections 218 & 220 generally reinforce hardpoint 136 proximate the first and second ends 208, 210. The first and second shrink-wrap sections 218 and 220 respectively overlap the outer sleeve 134, as at portion 222, and underlap the selectively detachable tube 216, as at portion 224.

There will now be shown a clamp assembly for use in establishing a grounded connection between the shielded cable 100 and an electrical housing or chassis over the intervals of hardpoints 136 and 138. Again, a variety of clamp assemblies may be used, and the demonstration of a preferred example should not be construed to impart undue limitation to the concepts that are disclosed herein because the teaching is by way of example and not by limitation.

FIG. 3 illustrates the clamp assembly in the form of an electrically conductive separable block 300 defining at least one aperture 302. The separable block 300 may in an identical manner also define additional apertures, such as aperture 304. A first generally L-shaped member 306 defines a first portion 308 of the aperture 302. A second generally L-shaped member 310 defines a second portion 312 of the aperture, such that the aperture 302 is completely defined when the first member 306 and the second member 310 are deployed opposite one another. The first portion 308 and the second portion 312 have respective diameters, preferably equal diameters, that accommodate the diameter of hardpoints 136 and 138 (see FIG. 1) after a portion of the selectively detachable tube 216 is removed. The first portion 308 and the second portion 312 of aperture 302 contain a series of continuous pressure ridges, such as ridges 314 and 316, that oppose one another to exert compressive forces on the hardpoints 136 and 138. Electrical contact between the separable block 300 and the electromagnetic shielding 126 is sufficient for establishing a grounded connection under the influence of these compressive forces. The first portion 308 and the second portion 312 are mirror images of one another.

The separable block 300 comprises a forward face 318 and a rearward face 320. Holes 322, 324, and 326 are provided for receipt of threaded fasteners that couple the first member 306 with the second member 310. The first member 306 presents a first side leg 328 that contains a hole 330 which is used to accommodate a threaded fastener (not shown). The second member 310 presents a second side leg 332 that contains a hole 334 which is also used to accommodate a threaded fastener (also not shown).

A gap tolerance along cut line 336 facilitates relative positioning of the first and second members 306, 310, to adjust the separation of these members across aperture 302 in varying the magnitude of compressive force F (see FIG. 2) as the electromagnetic shielding 126 is compressed between the conduit 200 and aperture 302. This gap is closed to zero as the first and second members are assembled onto the cable hardpoint and compressed onto the cable shield as the clamp assembly fasteners are tightened.

Figure 4:
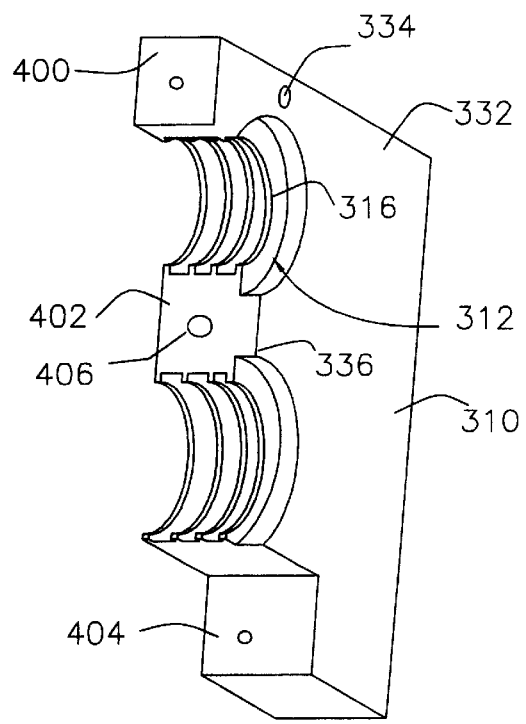
FIG. 4 depicts the second member of the separable block.

FIG. 4 depicts the second member 310 and reveals faces 400, 402, and 404, which follow cut line 336. These faces comprise holes, such as hole 406, in alignment with each of holes 322–326 for receipt of threaded fasteners.

Figure 5:
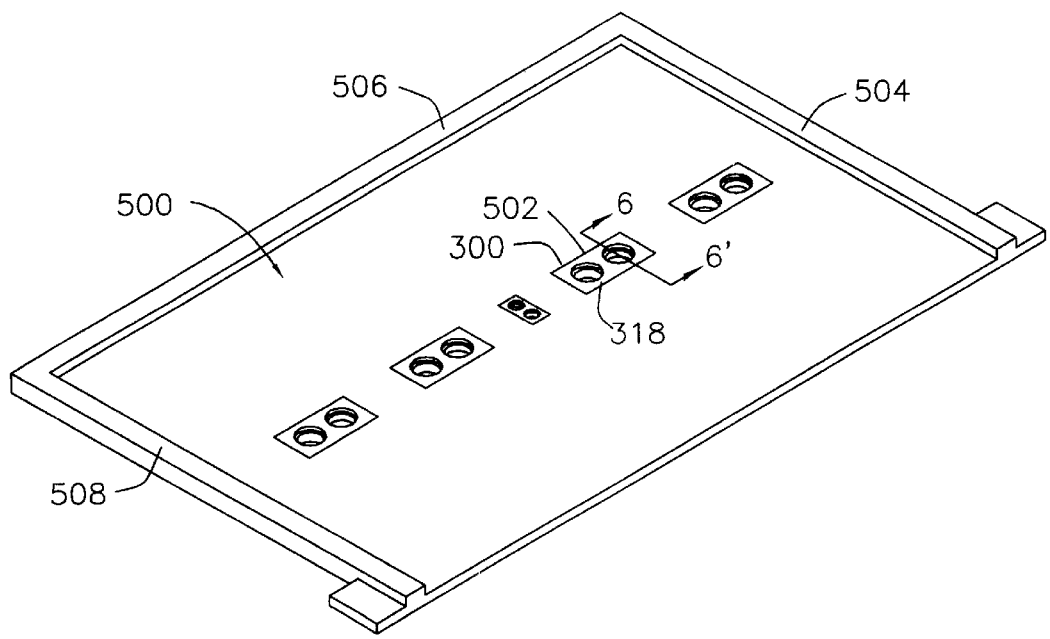
FIG. 5 depicts the separable block within a mounting panel that forms part of the electrical housing or chassis.

FIG. 5 depicts a front view of cable mounting panel 500, which contains a receptacle 502 that receives the separable block 300. The mounting panel 500 is part of an electrical housing or chassis. Mounting panel 500 contains mounting structure, such as channel bearing surfaces 504, 506, and 508, that cooperatively mate with other portions (not shown) of the electrical housing or chassis to provide an EMI enclosure.

Figure 6:
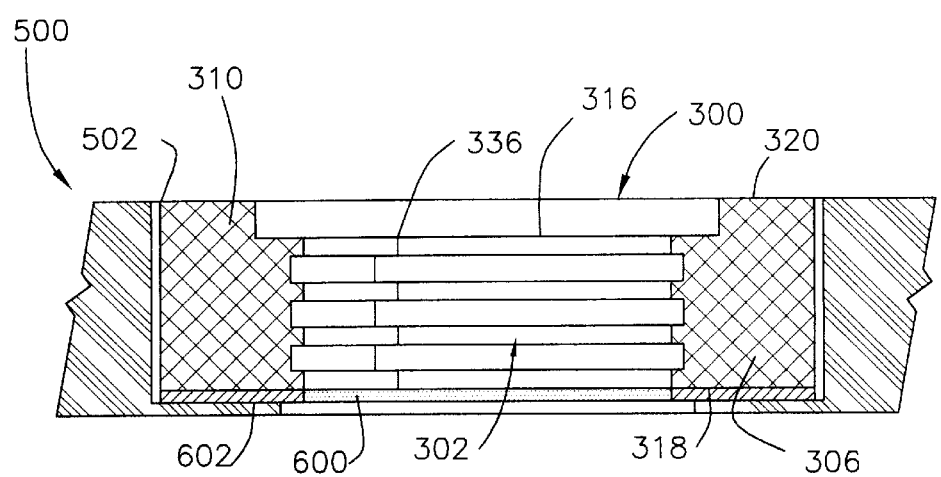
FIG. 6 is a midsectional view of the separable block within the receptacle taken along line 6–6' of FIG. 5.

FIG. 6 is a midsectional view taken along line 6–6' of FIG. 5. An electrically conductive mechanically compliant gasket 600 is provided within receptacle 502, either facing forward face 318, as shown in FIG. 6, or around the periphery of the receptacle 502 facing separable block 300. The gasket 600 forms an EMI seal. A forward overhanging lip 602, which may also be a separate backing plate, is threaded for receipt of threaded fasteners through, for example, holes 330 or 334 as shown in FIG. 3, and functions to retain the separable mounting block 300 in place within receptacle 502.

Figure 7:
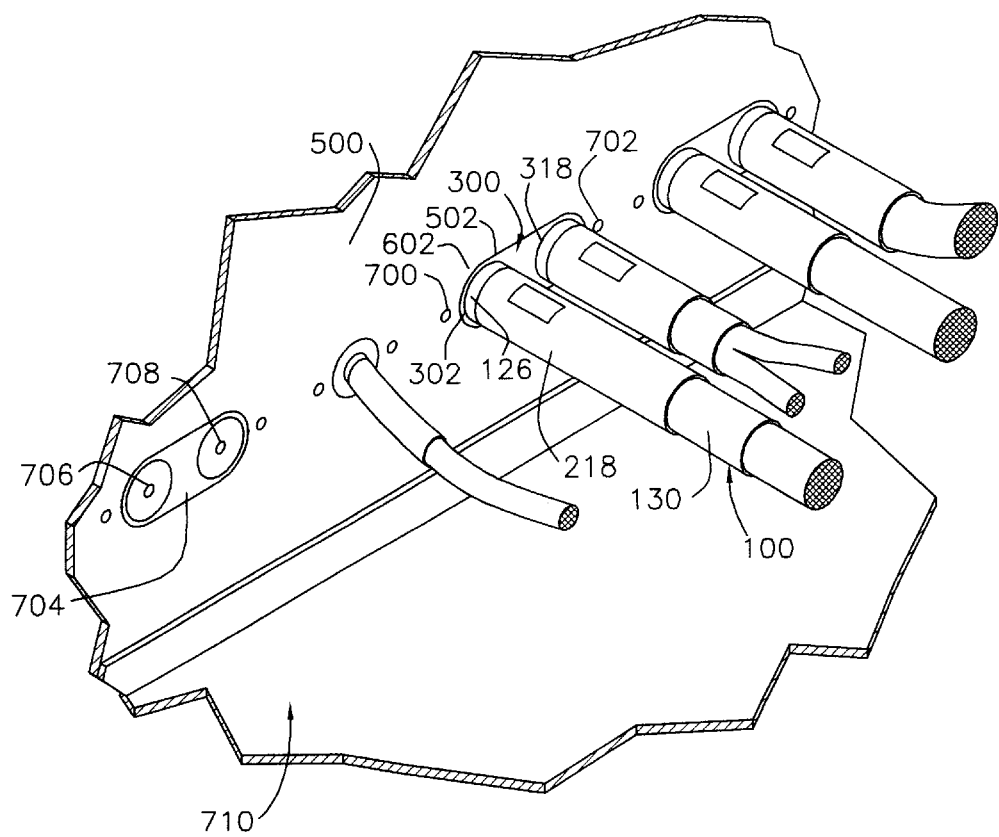
FIG. 7 is a rear view of the clamp assembly including the separable block with the shielded cable installed to ground.

FIG. 7 depicts a rear view of mounting panel 500 with separable block 300 installed in receptacle 502 and shielded cable 100 installed in aperture 302. Threaded fasteners 700 and 702 having threaded engagement with holes 330, 334, are used for establishing compressive force F to compress the electromagnetic shielding 126 against the forward face 318 of separable block 300 and the adjoining face of receptacle 502 according to the instrumentalities demonstrated in FIGS. 2–6, through which the electromagnetic shielding 126 is grounded to separable block 300 and mounting panel 500. A separable block 704 is identical to separable block 300, except a pair of plug blanks 706 and 708 are installed therein to seal an EMI enclosure 710.

In operation, the shielded cable 100 is grounded to the mounting panel 500 by separating the first and second members 306, 310 of separable block 300, and removing the selectively detachable tube 216 to accommodate the thickness of aperture 302, to create an exposed section of electromagnetic shielding 126 over hardpoint 134. The first member 306 and the second member 310 are placed around the exposed section of electromagnetic shielding 126 such that the exposed section of electromagnetic shielding 126 resides within the aperture 126. The first member 306 and the second member 310 are bolted together and inserted into the receptacle 502 of mounting plate 500. Threaded fasteners 700 and 702 are then installed to retain the separable mounting block in receptacle 502. An electrical ground contact is established between the separable block 300, electromagnetic shielding 126, the threaded fasteners 700, 702, overhanging lip 602, gasket 606, and mounting plate 500.

The foregoing discussion is intended to illustrate the concepts of the invention by way of example with emphasis upon the preferred embodiments and instrumentalities. Accordingly, the disclosed embodiments and instrumentalities are not exhaustive of all options or mannerisms for practicing the disclosed principles of the invention. The inventors hereby state their intention to rely upon the Doctrine of Equivalents in protecting the full scope and spirit of the invention.

What is claimed is:

1. A shielded cable assembly for use in conveying data signals through a chassis wall, comprising:
   at least one data transfer line;
   electromagnetic shielding surrounding the data transfer line;
   a first hardpoint comprising
      a conduit positioned around the data transfer line over an interval at a preselected location for use in passing through the chassis wall;

the conduit defining an interior passageway and having an exterior side;

the data transfer line passing through the interior passageway; and the electromagnetic shielding surrounding the exterior side;

an outer covering surrounding the data transfer line and the electromagnetic shielding, the outer covering being absent over at least a portion of the interval; and a selectively detachable tube covering the portion of the interval, the selectively detachable tube comprising a tear-away material.

2. The shielded cable assembly as set forth in claim 1, wherein the data transfer line comprises part of a cable bundle including a plurality of data transfer lines.

3. The shielded cable assembly as set forth in claim 1, comprising a protective covering surrounding the data transfer line and positioned within the electromagnetic shielding.

4. The shielded cable assembly as set forth in claim 3, wherein the protective covering is absent over a section of the interval.

5. The shielded cable assembly as set forth in claim 4, wherein the conduit has a first end inserted within the protective covering, a second end inserted within the protective covering, and a middle section comprising the section where the protective covering is absent.

6. The shielded cable assembly as set forth in claim 5, comprising an electrically insulative material positioned around the conduit and within the electromagnetic shielding.

7. The shielded cable assembly as set forth in claim 6, wherein the electrically insulative material is adhesive-backed electrical tape extending over the first end, the second end, and the middle section of the conduit.

8. The shielded cable assembly as set forth in claim 1, comprising an outer sleeve surrounding the data transfer line, the outer covering, and the electromagnetic shielding.

9. The shielded cable assembly as set forth in claim 8, wherein the outer sleeve is absent over the portion of the interval.

10. The shielded cable assembly as set forth in claim 1, wherein the selectively detachable tube comprises a pattern of holes spaced apart at distances that facilitate partial removal of the selectively detachable tube in predetermined lengths.

11. The shielded cable assembly as set forth in claim 1, comprising a shrink-wrap layer surrounding at least one end of the conduit, the shrink wrap layer overlapping the outer sleeve outboard of the outer sleeve and underlapping the selectively detachable tube inboard of the selectively detachable tube.

12. The shielded cable assembly as set forth in claim 1, wherein the data transfer line comprises a first end connected to a first cable coupling and a second end connected to a second cable coupling.

13. The shielded cable assembly as set forth in claim 1, comprising one or more additional hardpoints located at predetermined positions corresponding to desired locations for passage through an electrical housing different from the chassis.

14. The shielded cable assembly as set forth in claim 1, comprising a clamp assembly establishing a grounded connection between the electromagnetic shielding and the chassis by virtue of compressive forces over the interval between the clamp assembly and the conduit.

15. The shielded cable assembly as set forth in claim 14, wherein the conduit is sufficiently rigid to withstand the compressive forces from the clamp assembly while protecting the data transfer line from damage that would, otherwise, possibly inure to the data transfer line from the compressive forces.

* * * * *